United States Patent
Song et al.

(10) Patent No.: US 10,957,875 B2
(45) Date of Patent: Mar. 23, 2021

(54) DISPLAY APPARATUS

(71) Applicant: LG Display Co., Ltd., Seoul (KR)

(72) Inventors: JiHun Song, Paju-si (KR); UnJung Kim, Paju-si (KR); MinSeok Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/125,603

(22) Filed: Sep. 7, 2018

(65) Prior Publication Data

US 2019/0181378 A1 Jun. 13, 2019

(30) Foreign Application Priority Data

Dec. 11, 2017 (KR) .................. 10-2017-0169174

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3276* (2013.01); *H01L 51/0097* (2013.01); *H01L 51/529* (2013.01); *H01L 51/5246* (2013.01); *H01L 2251/5338* (2013.01)

(58) Field of Classification Search
CPC ............. H01L 51/5253; H01L 27/3276; H01L 51/0097; H01L 51/5246
See application file for complete search history.

(56) References Cited

U.S. PATENT DOCUMENTS

| | | | |
|---|---|---|---|
| 2002/0140347 A1* | 10/2002 | Weaver | H01L 25/047 313/506 |
| 2003/0143423 A1 | 7/2003 | McCormick et al. | |
| 2011/0039097 A1* | 2/2011 | Murashige | B32B 17/064 428/337 |
| 2012/0120364 A1 | 5/2012 | Wu et al. | |
| 2015/0179717 A1 | 6/2015 | Kawata | |
| 2015/0311468 A1 | 10/2015 | An et al. | |
| 2016/0028043 A1 | 1/2016 | Kwon et al. | |

(Continued)

FOREIGN PATENT DOCUMENTS

| | | |
|---|---|---|
| CN | 1618134 A | 5/2005 |
| CN | 103493589 B | 1/2014 |

(Continued)

OTHER PUBLICATIONS

Taiwan Intellectual Property Office, Office Action, TW Patent Application No. 107132480, dated Dec. 27, 2019, 12 pages.

(Continued)

*Primary Examiner* — James Wu
*Assistant Examiner* — Hung Q Dang
(74) *Attorney, Agent, or Firm* — Fenwick & West LLP

(57) ABSTRACT

Disclosed is a display apparatus for protecting a side surface of a substrate from the outside. The display apparatus includes a base substrate including a stepped portion, a buffer layer provided on the base substrate, a pixel array layer provided on the buffer layer, an encapsulation substrate provided on the pixel array layer, and a cover layer covering a side surface of the encapsulation substrate. The buffer layer covers the stepped portion of the base substrate.

13 Claims, 2 Drawing Sheets

(56) References Cited

U.S. PATENT DOCUMENTS

| | | | |
|---|---|---|---|
| 2016/0041679 A1* | 2/2016 | Ahn | ............... G06F 3/044 |
| | | | 345/173 |
| 2016/0095172 A1 | 3/2016 | Lee et al. | |
| 2016/0155966 A1* | 6/2016 | Kim | ............ H01L 51/0097 |
| | | | 257/40 |
| 2016/0155985 A1 | 6/2016 | Son et al. | |
| 2016/0323994 A1 | 11/2016 | Kwon et al. | |
| 2016/0363960 A1 | 12/2016 | Park et al. | |
| 2016/0374228 A1 | 12/2016 | Park et al. | |
| 2017/0250365 A1 | 8/2017 | Jin et al. | |
| 2017/0323957 A1 | 11/2017 | Yamazaki et al. | |
| 2018/0013080 A1* | 1/2018 | Kim | ............ H01L 27/3272 |
| 2018/0151835 A1* | 5/2018 | Kim | ............ H01L 51/0097 |
| 2018/0212192 A1 | 7/2018 | Jin et al. | |
| 2018/0269261 A1 | 9/2018 | Park | |

FOREIGN PATENT DOCUMENTS

| | | |
|---|---|---|
| CN | 104505467 A | 4/2015 |
| CN | 105470407 A | 4/2016 |
| CN | 105489786 A | 4/2016 |
| CN | 105655373 A | 6/2016 |
| CN | 106450032 A | 2/2017 |
| CN | 106601928 A | 4/2017 |
| EP | 3 439 054 A1 | 2/2019 |
| KR | 10-0670365 B1 | 1/2007 |
| TW | 201643096 A | 12/2016 |
| TW | 201701246 A | 1/2017 |
| WO | WO 2008/009929 A2 | 1/2008 |
| WO | WO 2013/046545 A1 | 4/2013 |
| WO | WO 2015/107035 A1 | 7/2015 |

OTHER PUBLICATIONS

The German Patent and Trademark Office, Office Action, DE Patent Application No. 10 2018 128 483.7, dated May 13, 2020, 11 pages (with concise explanation of relevance).

China National Intellectual Property Administration, Office Action, CN Patent Application No. 201811235006.1, dated Sep. 1, 2020, 17 pages.

* cited by examiner

DISPLAY APPARATUS

CROSS-REFERENCE TO RELATED APPLICATIONS

This application claims the benefit of the Republic of Korea Patent Application No. 10-2017-0169174 filed on Dec. 11, 2017, which is hereby incorporated by reference as if fully set forth herein.

BACKGROUND

Field of the Invention

The present disclosure relates to a display apparatus.

Discussion of the Related Art

With the advancement of information-oriented society, various requirements for display apparatuses for displaying an image are increasing. Recently, display apparatuses which are more slimmed are being released. Flexible display apparatuses and rollable display apparatuses are being produced.

In rollable display apparatuses, since an operation of rolling or unrolling a rollable display apparatus around or from a roller should be repeated, it is difficult for a separate protection case to be provided on a side surface, and since a side surface of a substrate is externally exposed as-is, issues such as the occurrence of cracks and penetration of water occur.

The above-described background is possessed by the inventor of the application for deriving the disclosure, or is technology information that has been acquired in deriving the disclosure. The above-described background is not necessarily known technology disclosed to the general public before the application of the disclosure.

SUMMARY

Accordingly, the present disclosure is directed to provide a display apparatus that substantially obviates one or more problems due to limitations and disadvantages of the related art.

An aspect of the present disclosure is directed to provide a display apparatus for protecting a side surface of a substrate from the outside.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, in one embodiment there is provided a display apparatus including a base substrate including a stepped portion, a buffer layer provided on the base substrate, a pixel array layer provided on the buffer layer, an encapsulation substrate provided on the pixel array layer, and a cover layer covering a side surface of the encapsulation substrate, wherein the buffer layer covers the stepped portion of the base substrate.

In another embodiment, a display apparatus comprises a base substrate including a first substrate and a second substrate, the second substrate extending toward, but short of, an edge of the first substrate, a buffer layer on a top surface of the second substrate and covering a side surface of the second substrate, a pixel array layer on the buffer layer; and an encapsulation substrate on the pixel array layer. The display apparatus may further comprise a cover layer covering side surfaces of the encapsulation substrate and the buffer layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
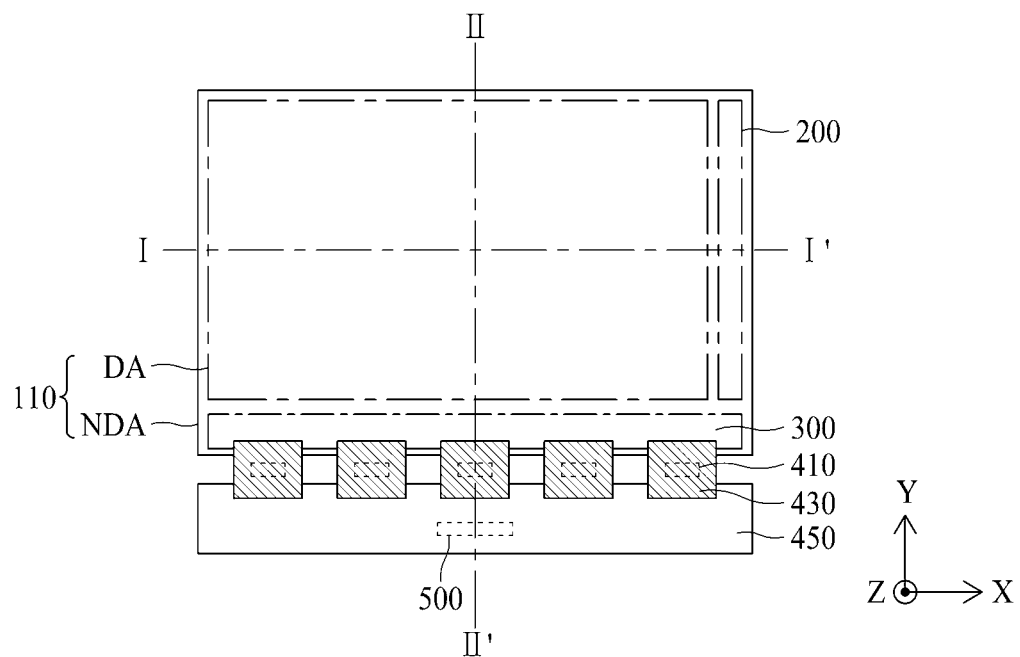
FIG. 1 is a plan view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a display apparatus according to the present disclosure will be described in detail with reference to the accompanying drawings. In the specification, in adding reference numerals for elements in each drawing, it should be noted that like reference numerals already used to denote like elements in other drawings are used for elements wherever possible.

FIG. 1 is a plan view illustrating a display apparatus according to an embodiment of the present disclosure. In FIG. 1, X axis represents a direction parallel to a gate line, Y axis represents a direction parallel to a data line, and Z axis represents a height direction of the display apparatus.

Referring to FIG. 1, the display apparatus according to an embodiment of the present disclosure may include a base substrate 110, a gate driver 200, a data pad part 300, a source drive integrated circuit (IC) 410, a flexible film 430, a circuit board 450, and a timing controller 500.

The base substrate 110 may be a flexible substrate, and for example, may include a transparent polyimide material. The base substrate 110 including the transparent polyimide material may be formed by curing a polyimide resin which is coated to have a certain thickness on a front surface of a release layer provided on a carrier glass substrate. The carrier glass substrate may be separated from the base substrate 110 by releasing the release layer through a laser release process. A plurality of gate lines, a plurality of data lines, and a plurality of pixels may be provided on one surface of the base substrate 110. Each of the plurality of pixels may include a plurality of subpixels, and the plurality of subpixels may be respectively provided in a plurality of areas defined by intersections of the data lines and the gate lines.

The base substrate 110 according to an embodiment may include a display area DA and a non-display area NDA.

The display area DA may be an area which displays an image, and may be defined in a middle portion of the base substrate 110. The gate lines, the data lines, and the pixels may be provided in the display area DA.

The non-display area NDA may be an area which does not display an image, and may be defined in an edge of the base substrate 110 to surround the display area DA. The gate driver 200 and the data pad part 300 may be provided in the non-display area NDA.

The gate driver 200 may supply gate signals to the gate lines according to a gate control signal received from the timing controller 500. The gate driver 200 may be provided as a gate driver in panel (GIP) type in the non-display area NDA at one outside of the display area DA of the base substrate 110.

The data pad part 300 may supply data signals to the data lines according to a data control signal received from the timing controller 500. The data pad part 300 may be manufactured as a driving chip, mounted on the flexible film 430, and attached on the non-display area NDA at one outside of the display area DA of the base substrate 110 in a tape automated bonding (TAB) type.

The source drive IC 410 may receive digital video data and a source control signal from the timing controller 500. The source drive IC 410 may convert the digital video data into analog data voltages and may supply the converted analog data voltages to the data lines, based on the source control signal. In a case that the source drive IC 410 is manufactured as a driving chip, the source drive IC 410 may be attached on the flexible film 430 in a chip-on film (COF) type or a chip-on plastic (COP) type.

Lines connecting the data pad part 300 to the source drive IC 410 and lines connecting the data pad part 300 to the circuit board 450 may be provided on the flexible film 430. The flexible film 430 may be attached on the data pad part 300 by using an anisotropic conductive film, and thus, the data pad part 300 may be connected to the lines of the flexible film 430.

The circuit board 450 may be attached on the flexible film 430. A plurality of circuits implemented as a plurality of driving chips may be mounted on the circuit board 450. For example, the timing controller 500 may be mounted on the circuit board 450. The circuit board 450 may be a printed circuit board (PCB) or a flexible PCB (FPCB).

The timing controller 500 may receive the digital video data and a timing signal from an external system board through a cable of the circuit board 450. The timing controller 500 may generate a gate control signal for controlling an operation timing of the gate driver 200 and a source control signal for controlling an operation timing of the source drive IC 410 which is provided in plurality, based on the timing signal. The timing controller 500 may supply the gate control signal to the gate driver 200 and may supply the source control signal to the source drive ICs 410.

Figure 2:
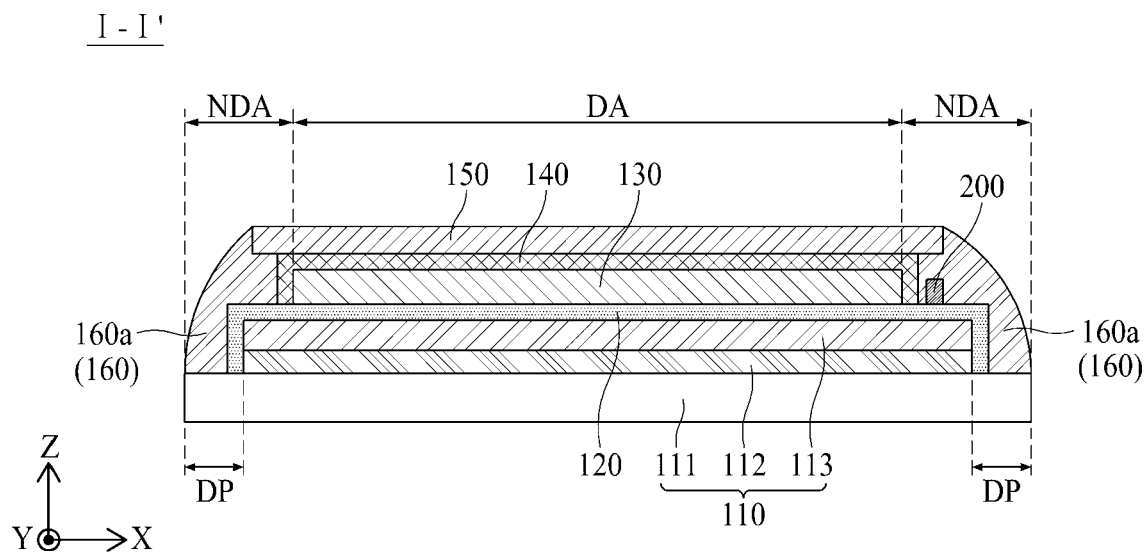
FIG. 2 is a cross-sectional view taken along line I-I' of FIG. 1.
Figure 3:
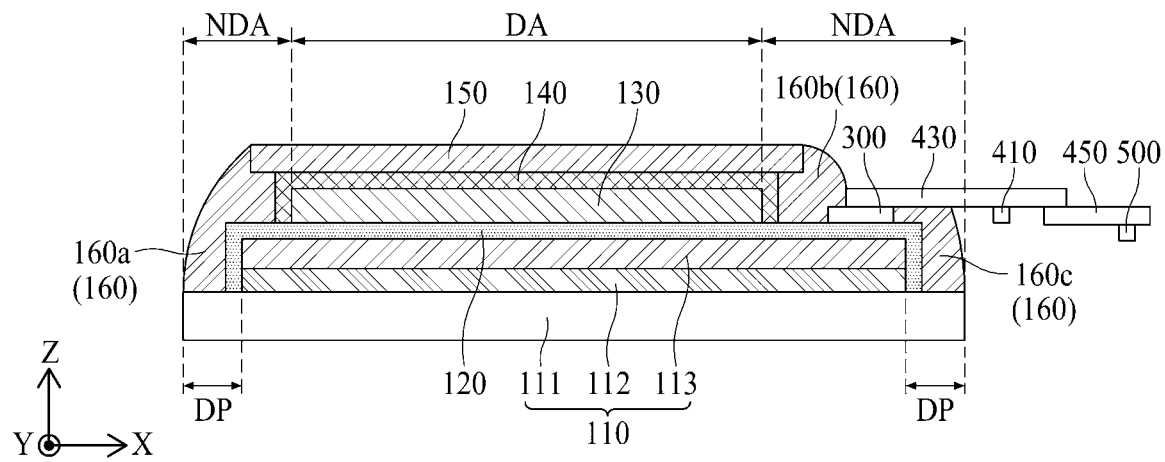
FIG. 3 is a cross-sectional view taken along line II-II' of FIG. 1.

FIG. 2 is a cross-sectional view taken along line I-I' of FIG. 1. FIG. 3 is a cross-sectional view taken along line II-II' of FIG. 1. Descriptions of the same elements as the elements of FIG. 1 are omitted.

Referring to FIGS. 2 and 3, a display apparatus according to an embodiment of the present disclosure may include a base substrate 110, a buffer layer 120, a pixel array layer 130, an encapsulation substrate 150, and a cover layer 160.

The base substrate 110 may be a flexible substrate, and for example, may include a transparent polyimide material. The base substrate 110 may include a first substrate 111, a heat dissipation layer 112, and a second substrate 113.

The first substrate 111 may be a flexible substrate, and for example, may include a transparent polyimide material.

The heat dissipation layer 112 may be provided on the first substrate 111. The heat dissipation layer 112 may be formed of a material having high thermal conductivity, for externally radiating the heat energy which occurs in the pixel array layer 130. For example, the heat dissipation layer 112 may be formed of one inorganic layer of aluminum oxide (AlOx) and titanium oxide (TiOx).

The second substrate 113 may be provided on the heat dissipation layer 112. The second substrate 113 may be a flexible substrate, and for example, may include a transparent polyimide material.

The first substrate 111 according to an embodiment may be provided to have an area which is greater than an area of the heat dissipation layer 112 and an area of the second substrate 113. That is, the base substrate 110 according to an embodiment may be provided in a stacked substrate structure including a stepped portion DP. For example, the heat dissipation layer 112 may be provided in a middle portion, except an edge, of the first substrate 111, and the second substrate 113 may be provided on the heat dissipation layer 112 to cover the entire surface of the heat dissipation layer 112. Here, the edge of the first substrate 111 may be a portion in which the heat dissipation layer 112 and the second substrate 113 are not provided, and thus, a step shape may be formed in the boundary area between the edge portion and the middle portion of the first substrate 111. In this case, a portion where the step shape is formed may be defined as the stepped portion DP.

The buffer layer 120 may be provided on the base substrate 110. For example, the buffer layer 120 may be provided on the second substrate 113. The buffer layer 120 may be provided on the entire upper surface of the second substrate 113, for preventing water or moisture from permeating into the pixel array layer 130 via the base substrate 110. The buffer layer 120 according to an embodiment may be formed of a plurality of inorganic layers which are alternately stacked. For example, the buffer layer 120 may be formed of a multilayer in which one or more inorganic layers of silicon oxide (SiOx), silicon nitride (SiNx), and silicon oxynitride (SiON) are alternately stacked.

The buffer layer 120 according to an embodiment may be provided to cover the stepped portion DP. For example, the buffer layer 120 may be provided on the second substrate 113 and may cover an upper surface of the second substrate 113 and the side (vertical) surfaces of each of the second substrate 113 and the heat dissipation layer 112. When a crack is occurred at the side end of the upper surface of the first substrate 111, the crack will not extend into the side end of the second substrate 113 and the heat dissipation layer 112, because the buffer layer 120 may be provided to cover the side surface of the second substrate 113 and the heat dissipation layer 112.

The pixel array layer 130 may be disposed in a display area DA of the base substrate 110. That is, the pixel array layer 130 may be provided on the buffer layer 120 overlapping the display area DA defined on the base substrate 110.

The pixel array layer 130 may include a plurality of scan lines, a plurality of data lines, a plurality of driving power lines, a pixel driving circuit, and a light emitting device layer.

The scan lines may be arranged in parallel with a first lengthwise direction X of the base substrate 110 and may be spaced apart from each another, along a second lengthwise direction Y of the base substrate 110.

The data lines may be arranged in parallel with the second lengthwise direction Y of the base substrate 110 and may be spaced apart from each another along the first lengthwise direction X of the base substrate 110.

The driving power lines may be arranged in parallel with the data lines.

The pixel driving circuit may be provided in each of a plurality of pixel areas defined by intersections of the scan lines and the data lines and may include at least two thin film transistors (TFTs) and at least one capacitor. The pixel driving circuit may allow the light emitting device layer to emit light according to a scan signal supplied through an adjacent scan line, a driving power supplied through an adjacent driving power line, and a data signal supplied through an adjacent data line.

The light emitting device layer may emit light, based on a data signal supplied from the pixel driving circuit of a corresponding pixel. The light emitted from the light emitting device layer may pass through the base substrate 110 and may be extracted to the outside. The light emitting device layer may include a first electrode connected to the pixel driving circuit of a corresponding pixel, a light emitting layer provided on the first electrode, and a second electrode provided on the light emitting layer.

The first electrode may be an anode electrode which is individually patterned in each of a plurality of pixels. The first electrode may be formed of a transparent metal material such as indium tin oxide (ITO) or indium zinc oxide (IZO) capable of transmitting light.

The light emitting layer according to an embodiment may include a red light emitting layer, a green light emitting layer, and a blue light emitting layer, which each emit light corresponding to a color set in a corresponding pixel.

According to another embodiment, the light emitting layer may be a common layer which is provided in common in the plurality of pixels, and in this case, a manufacturing process is simplified. The light emitting layer may include one of an organic light emitting layer, an inorganic light emitting layer, and a quantum dot light emitting layer, or may include a stacked or mixed structure of an organic light emitting layer or an inorganic light emitting layer and a quantum dot light emitting layer. The light emitting layer may include two or more light emitting parts for emitting white light. For example, the light emitting layer may include a first light emitting part and a second light emitting part for emitting the white light based on a combination of first color light and second color light. Here, the first light emitting part may emit the first color light and may include one of a blue light emitting part, a green light emitting part, a red light emitting part, a yellow light emitting part, and a yellow-green light emitting part. The second light emitting part may emit the second color light and may include a light emitting part emitting light having a complementary color relationship of the first color light among a blue light emitting part, a green light emitting part, a red light emitting part, a yellow light emitting part, and a yellow-green emitting part.

The second electrode, a cathode electrode, may be a common layer which is provided in common in the plurality of pixels. The second electrode may include a metal material, which is high in reflectivity. For example, the second electrode may be formed in a multilayer structure such as a stacked structure of Al and Ti (Ti/Al/Ti), a stacked structure of Al and ITO (ITO/Al/ITO), an APC alloy (Ag/Pd/Cu), or a stacked structure of an APC alloy and ITO (ITO/APC/ITO), or may include a single-layer structure including one material or two or more alloy materials selected from among Ag, Al, Mo, Au, Mg, calcium (Ca), and barium (Ba).

The encapsulation substrate 150 may be disposed on the pixel array layer 130 and may include a first surface adjacent to the pixel array layer 130 and a second surface opposite to the first surface. The first surface of the encapsulation substrate 150 may be attached on the pixel array layer 130. The encapsulation substrate 150 may primarily prevent oxygen, water, moisture or particles from penetrating and/or permeating into the light emitting device layer.

The encapsulation substrate 150 according to an embodiment may be a metal foil, a metal sheet, or a metal plate, which is formed of an opaque metal material. For example, the encapsulation substrate 150 may be formed of an alloy of iron (Fe) and nickel (Ni) having a low thermal expansion coefficient, but is not limited thereto.

The first surface of the encapsulation substrate 150 may be attached on the pixel array layer 130 by an adhesive layer 140. The adhesive layer 140 may be a thermocurable adhesive, a naturally curable adhesive, or the like. For example, the adhesive layer 140 may be formed of a material such as a pressure sensitive adhesive or a barrier pressure sensitive adhesive having an absorption function.

The cover layer 160 may be provided in a non-display area NDA of the base substrate 110 to cover a side surface of the encapsulation substrate 150. The cover layer 160 may include a polymer material, and for example, may be formed of urethane, acryl, or/and the like. The cover layer 160 according to an embodiment may be provided higher in height than the adhesive layer 140 in the non-display area NA contacting the display area DA of the base substrate 110 and may prevent penetration of external water passing through the adhesive layer 140.

The cover layer 160 according to an embodiment may be provided to cover a side surface of the buffer layer 120. In the display apparatus according to the present disclosure, the buffer layer 120 may cover top surface of the base substrate 110 but may not be extended to the most end side of the base substrate 110. The buffer layer 120 may be provided to cover the stepped portion DP of the base substrate 110. The cover layer 160 may be provided to cover the side surface of the buffer layer 120. Therefore, the cover layer 160 may prevent the buffer layer 120 from being exposed at the outside environment. As the result, the cover layer 160 may prevent the interface separation problem which is caused by a crack occurring when a boundary between the buffer layer 120 and the base substrate 110 is exposed at the outside environment.

The cover layer 160 according to an embodiment may be provided for preventing the base substrate 110 from being rolled while the carrier glass substrate is separated from the base substrate 110 by releasing the release layer through the laser release process. In detail, the encapsulation substrate 150 may not be provided in the non-display area NDA of the base substrate 110, and for this reason, the base substrate 110 which is flexible and has a thin thickness is rolled. The cover layer 160 may be provided in the non-display area NDA of the base substrate 110 to prevent the base substrate 110 from being rolled.

Referring to FIG. 3, the cover layer 160 according to an embodiment may include a first cover part 160a, a second cover part 160b, and a third cover part 160c.

The first cover part 160a may be provided to cover the edges of the buffer layer 120, except one edge on which the data pad part 300 is provided. That is, the first cover part 160a may be provided in any region of the non-display area NDA, except a region where the data pad part 300 is provided. For example, the data pad part 300 may be provided in a lower portion of the non-display area NDA, and the first cover part 160a may be provided in an upper portion, a left portion, and a right portion of the non-display area NDA.

The first cover part 160a according to an embodiment may be provided to cover the side (vertical) surface of the buffer layer 120 and the side (vertical) surface of the encapsulation substrate 150. The first cover part 160a may be provided in the non-display area NDA of the base substrate 110 to cover the side surface of the encapsulation substrate 150 and may prevent penetration/permeating of external water, moisture, gases or particles passing through the adhesive layer 140. Also, the first cover part 160a may be provided to cover the side surface of the buffer layer 120, thereby preventing the buffer layer 120 from being exposed at the outside environment and preventing interface separation problem which is caused by a crack occurring when the boundary between the buffer layer 120 and the base substrate 110 is exposed at the outside environment.

The second cover part 160b may be provided on the buffer layer 120 and may contact a left portion of the data pad part 300. The second cover part 160b may be provided to cover the left portion of the data pad part 300, thereby protecting the data pad part 300 from the outside environment. The second cover part 160b according to an embodiment may be provided to cover the side surface of the encapsulation substrate 150. The second cover part 160b may be provided in the non-display area NDA of the base substrate 110 to cover the side surface of the encapsulation substrate 150 and may prevent penetration/permeating of external water, moisture, gases or particles passing through the adhesive layer 140. The second cover part 160b according to an embodiment may contact the left portion of the data pad part 300 and the left portion of the flexible film 430.

The third cover part 160c may be provided to contact a right portion of the data pad part 300. The third cover part 160c may surround a side surface of data pad part 300 in order for the right portion of the data pad part 300 not to be exposed at the outside environment. The third cover part 160c according to an embodiment may be provided to cover the side surface of the buffer layer 120. The third cover part 160c may be provided to cover the side surface of the buffer layer 120, thereby preventing the buffer layer 120 from being exposed at the outside and preventing the interface separation problem which is caused by a crack occurring when the boundary between the buffer layer 120 and the base substrate 110 is exposed at the outside environment. The third cover part 160c according to an embodiment may contact the right portion of the data pad part 300 and the lower surface of the flexible film 430.

As described above, the first cover part 160a may be provided to cover the side surface of each of the buffer layer 120 and the encapsulation substrate 150 in an area where the data pad part 300 is not provided, thereby preventing external water, moisture, gases or particles from penetrating/permeating into a light emitting device. Also, the second cover part 160b covering the side surface of the encapsulation substrate 150 and the third cover part 160c covering the side surface of the buffer layer 120 may be divisionally provided in an area where the data pad part 300 is provided, thereby preventing external water, moisture, gases or particles from penetrating/permeating into the light emitting device.

Moreover, since the display apparatus according to the present disclosure includes the base substrate 110 including the multi substrate structure, the anti-moisture ability at the front surface can be reinforced, and the stiffness of the front surface can be increased. Also, since the display apparatus according to the present disclosure includes the buffer layer 120 covering the stepped portion DP of the base substrate 110 and the cover layer 160 covering the side surface of the buffer layer 120, the side stiffness also can be increased, and the occurrence of a failure caused by penetration/permeation of water, moisture, gases or particles through side portions is reduced.

Figure 4:
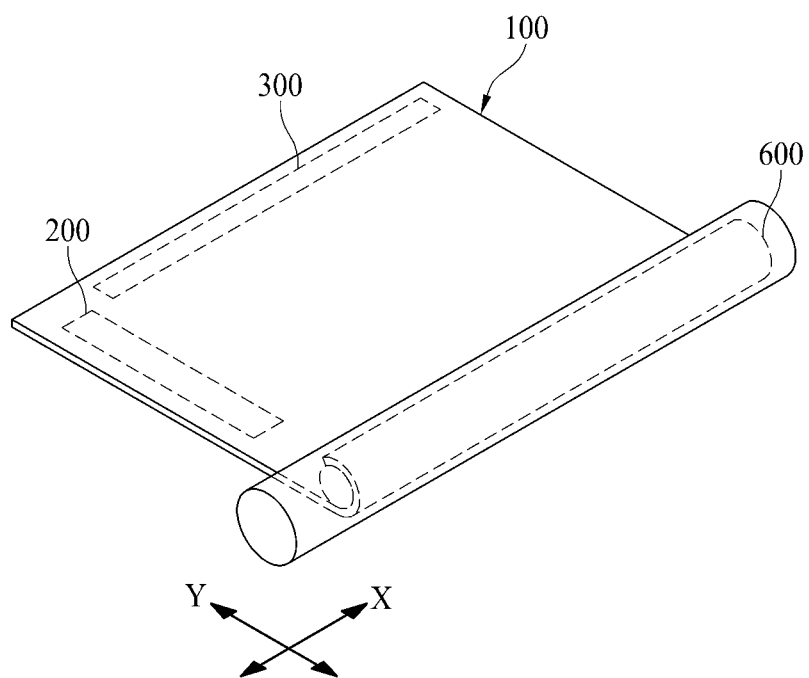
FIG. 4 is a schematic diagram of a rollable display system according to an embodiment of the present disclosure.

FIG. 4 is a schematic diagram of a rollable display system according to an embodiment of the present disclosure.

Referring to FIG. 4, the rollable display system according to an embodiment of the present disclosure may include a roller 600 and a display apparatus 100 which is provided so as to be rolled around the roller 600.

The display apparatus 100 may be the above-described display apparatus according to the present disclosure, and thus, its overlapping description is omitted.

The roller 600 may be driven by a separated driving device and may roll or unroll the display apparatus 100. Therefore, when a user does not watch an image, the roller 600 may maintain a state in which the display apparatus 100 is rolled around the roller 600. When the user wants to watch an image, the roller 600 may unroll the rolled display apparatus 100.

In order to configure the rollable display system, a position of a circuit driver included in the display apparatus 100 may be appropriately adjusted. In detail, in the display apparatus 100, since the data pad part 300 is connected to the circuit board 450 through the flexible film 430, it is not easy for the display apparatus 100 to be rolled by the roller 600. Therefore, as illustrated, the data pad part 300 may be arranged in a lengthwise direction X of the roller 600 in an upper non-display area of the display apparatus 100. Also, when the gate driver 200 is provided in a side non-display area of the display apparatus 100, the gate driver 200 may be provided as a GIP type in which the circuit is directly formed on a substrate.

Moreover, the display apparatus 100 according to the present disclosure is suitable to configure the rollable display system. In the rollable display system, the display apparatus 100 should repeat a roll-in or roll-out operation. However, it is difficult for a separate protection case to be provided on a side surface, whereby it is vulnerable to protect sides. On the other hand, since the display apparatus 100 according to the present disclosure includes the buffer layer 120 covering the stepped portion DP of the base substrate 110 and the cover layer 160 covering the side surface of the buffer layer 120, the side stiffness can be ensured, and the occurrence of a failure caused by penetration/permeation of water, moisture, gases or particles through side portion is reduced. Accordingly, a problem such as an error occurring in the rollable display system is solved.

As described above, in the display apparatus according to the embodiments of the present disclosure, the front anti-moisture function is reinforced, and the front rigid characteristic increases.

Moreover, in the display apparatus according to the embodiments of the present disclosure, the occurrence of an error caused by penetration of water through sides is reduced, and the side rigid characteristic increases.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a base substrate including a display area, a non-display area and a stepped portion;
   a buffer layer provided on the base substrate;
   a pixel array layer provided on the buffer layer;
   an encapsulation substrate provided on the pixel array layer; and
   a cover layer provided on the non-display area and covering a side surface of the encapsulation substrate,
   wherein the buffer layer covers the stepped portion of the base substrate,
   wherein the base substrate comprises:
      a first substrate;
      a heat dissipation layer provided on the first substrate; and
      a second substrate provided on the heat dissipation layer,
   wherein the first substrate has a surface area greater than surface areas of the second substrate and the heat dissipation layer, and
   wherein the buffer layer covers a side surface of the second substrate and a side surface of the heat dissipation layer.

2. The display apparatus of claim 1, wherein the cover layer covers a side surface of the buffer layer.

3. The display apparatus of claim 1, further comprising a data pad part provided on a portion of the buffer layer, wherein the cover layer contacts a side surface of the data pad part.

4. The display apparatus of claim 3, wherein the cover layer comprises:
   a first cover part covering edges of the buffer layer, except one edge including the data pad part;
   a second cover part contacting a first side portion of the data pad part; and
   a third cover part contacting a second side portion of the data pad part.

5. The display apparatus of claim 4, wherein the first cover part covers a side surface of the encapsulation substrate and a side surface of the buffer layer.

6. The display apparatus of claim 4, wherein the second cover part covers a side surface of the encapsulation substrate, and the third cover part covers a side surface of the buffer layer.

7. A rollable display system comprising:
   a roller; and
   the display apparatus according to claim 1.

8. The rollable display system of claim 7, further comprising a gate driver provided in a side portion of the display apparatus, the side portion not being parallel to a lengthwise direction of the roller.

9. A display apparatus comprising:
   a base substrate including a first substrate, a heat dissipation layer provided on the first substrate, and a second substrate, the second substrate extending toward, but short of, an edge of the first substrate, and the second substrate extending toward an edge of the heat dissipation layer;
   a buffer layer on a top surface of the second substrate and covering a side surface of the second substrate and a side surface of the heat dissipation layer;

a pixel array layer on the buffer layer;

an encapsulation substrate on the pixel array layer;

a cover layer covering side surfaces of the encapsulation substrate and the buffer layer; and a data pad part on a portion of the buffer layer, wherein the cover layer contacts a side surface of the data pad part.

10. The display apparatus of claim 9, wherein the buffer layer extends toward the edge of the first substrate further than the second substrate extending toward the edge of the first substrate.

11. The display apparatus of claim 9, wherein the cover layer comprises:

a first cover part covering a plurality of edges of the buffer layer, except one edge including the data pad part, the first cover part covering the side surfaces of the encapsulation substrate and the buffer layer;

a second cover part contacting a first side portion of the data pad part and covering the side surface of the encapsulation substrate; and a third cover part contacting a second side portion of the data pad part and covering the side surface of the buffer layer.

12. A rollable display system comprising:

a roller; and the display apparatus according to claim 9, wherein the display apparatus is configured to be rolled to the roller.

13. The rollable display system of claim 12, further comprising a gate driver provided in a side portion of the display apparatus, the side portion not being parallel to a lengthwise direction of the roller.

* * * * *